United States Patent [19]

Kakizoe et al.

[11] Patent Number: 5,210,436
[45] Date of Patent: May 11, 1993

[54] SEMICONDUCTOR DEVICE WITH INPUT PROTECTION CIRCUIT OF HIGH WITHSTAND VOLTAGE

[75] Inventors: Kazuhiko Kakizoe; Hiroaki Murakami, both of Tokyo, Japan

[73] Assignee: Kabushiki Kaisha Toshiba, Kawasaki, Japan

[21] Appl. No.: 725,070

[22] Filed: Jul. 5, 1991

[30] Foreign Application Priority Data

Jul. 6, 1990 [JP] Japan ................. 2-177467

[51] Int. Cl.$^5$ ............... H01L 29/78; H01L 27/02
[52] U.S. Cl. ................... 257/361; 257/344; 257/408; 257/315
[58] Field of Search ............... 357/23.13, 13, 41

[56] References Cited

U.S. PATENT DOCUMENTS

| | | | |
|---|---|---|---|
| 4,602,267 | 7/1986 | Shirato | 357/23.13 |
| 4,893,157 | 1/1990 | Miyazawa et al. | 357/23.13 |
| 5,142,345 | 8/1992 | Miyata | 357/23.13 |

FOREIGN PATENT DOCUMENTS

| | | |
|---|---|---|
| 0161446 | 11/1985 | European Pat. Off. |
| 0189914A2 | 8/1986 | European Pat. Off. |
| 61-95568 | 5/1986 | Japan . |
| 61-133655 | 6/1986 | Japan . |
| 63-202056 | 8/1988 | Japan . |

Primary Examiner—Gene M. Munson
Attorney, Agent, or Firm—Foley & Lardner

[57] ABSTRACT

A semiconductor device equipped with an input protection circuit having a high withstand voltage and an improved reliability. The input protection circuit of the semiconductor device includes a gate insulation film provided on the semiconductor substrate corresponding to a region between the source region and the drain region, having a thickness greater than that of a gate insulation film in the FET of the semiconductor device, where one of the source region and the drain region is connected with an external input terminal for the semiconductor device, while the gate electrode and the other one of the source region and the drain region are connected with a power source for the semiconductor device.

22 Claims, 5 Drawing Sheets

(a) (b) (c)

(a) (b) (c)

SEMICONDUCTOR DEVICE WITH INPUT PROTECTION CIRCUIT OF HIGH WITHSTAND VOLTAGE

BACKGROUND OF THE INVENTION

Field of the Invention

The present invention relates to a semiconductor device equipped with an input protection circuit of a high withstand voltage.

Description of the Background Art

A semiconductor device such as an EEPROM in a non-volatile memory is constructed from two types of field effect transistors (FET) provided on a common semiconductor chip to which different voltages are applied.

For example, an EEPROM of a floating gate type is usually constructed from an ordinary voltage FET to be operated by an ordinary power source (5V for example) for usual operations and a high withstand voltage FET in which writing and deleting operations are carried out by using a high voltage (about 20V for example).

The ordinary voltage FET to be operated by the ordinary power source has a configuration shown in a section (b) of FIG. 1 which comprises: a semiconductor substrate 1: a source region 2b and a drain region 2b formed in the semiconductor substrate 1: a gate insulation film 4b formed on the semiconductor substrate 1 at a portion sandwiched between the source region 2b and the drain region 2b; a semiconductor poly-crystalline layer 5b as a gate electrode provided on the gate insulation film 4b; and a source electrode 6b and a drain electrode 6b which are formed on the source region 2b and the drain region 2b.

In this ordinary voltage FET, the electric field strength between the source region 2b and the drain region 2b is increased as a film thickness x of the gate insulation film 4b is made as thin as 250 Å or less, such that the generation of the hot carriers becomes prominent. As a result, the hot electrons are accumulated in the gate insulation film 4b, so that the threshold voltage is increased while the current is decreased. In order to suppress such an increase of the threshold voltage and the decrease of the current, the FET shown in a section (b) of FIG. 1 further comprises low concentration diffusion layer regions 8b provided adjacent to the source region 2b and the drain region 2b at portions underneath the gate insulation film 4b corresponding to the intervals between the semiconductor poly-crystalline layer 5b and each one of the source electrode 6b and the drain electrode 6b. This structure is called an LDD (Lightly Doped Drain) structure which is capable of weakening the high electric field strength.

On the other hand, the high withstand voltage FET has a configuration shown in a section (c) of FIG. 1 which comprises: a semiconductor substrate 1; a source region 2c and a drain region 2c formed in the semiconductor substrate 1; a thick gate insulation film 10c formed on the semiconductor substrate 1 at a portion sandwiched between the source region 2c and the drain region 2c; a first semiconductor poly-crystalline layer 9c as a first gate electrode formed inside the thick gate insulation film 10c; a second semiconductor poly-crystalline layer 11c as a second gate electrode provided on the thick gate insulation film 10c; and a source electrode 6c and a drain electrode 6c which are formed on the source region 2c and the drain region 2c.

In this high withstand voltage FET the film thickness y for a portion of the thick gate insulation film 10c located between the first semiconductor poly-crystalline layer 9c and the semiconductor substrate 1 is made to be thicker than the film thickness x of the gate insulation film 4b of the ordinary voltage FET shown in a section (b) of FIG. 1, so as to prevent the electrostatic destruction of the insulation of the thick gate insulation film 10c even when a high voltage is applied to the gate electrodes.

Now, this type of a semiconductor device is equipped with an input protection circuit provided between an input circuit and an input (or input and output) terminal, in order to protect the device from the electrostatic destruction of the insulation.

Such an input protection circuit has a configuration shown in a section (a) of FIG. 1 which comprises: a semiconductor substrate 1: a source region 2a and a drain region 2a formed in the semiconductor substrate 1; a gate insulation film 4a formed on the semiconductor substrate 1 at a portion sandwiched between the source region 2a and the drain region 2a, which is identical to the gate insulation film 4b of the ordinary voltage FET; a semiconductor poly-crystalline layer 5a as a gate electrode provided on the gate insulation film 4a; a source electrode 6a and a drain electrode 6a which are formed on the source region 2a and the drain region 2a; and an LDD structure formed by low concentration diffusion layer regions 8a provided adjacent to the source region 2a and the drain region 2a at portions underneath the gate insulation film 4a corresponding to the intervals between the semiconductor poly-crystalline layer 5a and each one of the source electrode 6a and the drain electrode 6a, where the gate electrode 5a and one of the source electrode 6a and the drain electrode 6a are connected with a power source 12, while the other one of the source electrode 6a and the drain electrode 6a is connected with the input terminal 13.

However, when the FET with the LDD structure is employed for the input protection circuit as described above, the low concentration diffusion layer regions 8a generate the heat as the excessive voltage is applied to the input terminal 18 because the diffusion layer regions 8a have high resistance. As a result, a junction between the diffusion layer regions 8a and the semiconductor substrate 1 becomes vulnerable because of this heat and this in turn caused the lowering of the withstand voltage.

SUMMARY OF THE INVENTION

It is therefore an object of the present invention to provide a semiconductor device equipped with an input protection circuit having a high withstand voltage and an improved reliability.

According to one aspect of the present invention there is provided an input protection circuit for a semiconductor device using a FET comprising: a semiconductor substrate: a source region formed in the semiconductor substrate: a drain region formed in the semiconductor substrate: a gate insulation film provided on the semiconductor substrate corresponding to a region between the source region and the drain region, having a thickness greater than that of a gate insulation film in the FET of the semiconductor device: and a gate electrode provided on the gate S insulation film: wherein one of the source region and the drain region is connected with an external input terminal for the semiconductor device while the gate electrode and the other one of the source region and the drain region are connected with a power source for the semiconductor device.

According to another aspect of the present invention there is provided a semiconductor device comprising: a FET: and an input protection device including: a semiconductor substrate, a source region formed in the semiconductor substrate, a drain region formed in the semiconductor substrate, a gate insulation film provided on the semiconductor substrate corresponding to a region between the source region and the drain region, having a thickness greater than that of a gate insulation film in the FET of the semiconductor device, and a gate electrode provided on the gate insulation film: wherein one of the source region and the drain region is connected with an external input terminal for the semiconductor device, while the gate electrode and the other one of the source region and the drain region are connected with a power source for the semiconductor device.

Other features and advantages of the present invention will become apparent from the following description taken in conjunction with the accompanying drawings.

DETAILED DESCRIPTION OF THE PREFERRED EMBODIMENTS

Now, the various embodiments of a semiconductor device equipped with an input protection circuit according to the present invention will be described with references to the drawings. In the following description, the embodiments are described in a form of a semiconductor device constructed from an ordinary voltage FET to be operated by an ordinary power source (5V for example) for usual operations and a high withstand voltage FET in which writing and deleting operations are carried out by using a high voltage (about 20V for example), which is equipped with an input protection circuit provided between an input circuit and an input (or input and output) terminal, in order to protect the device from the electrostatic destruction of the insulation.

Figure 2:
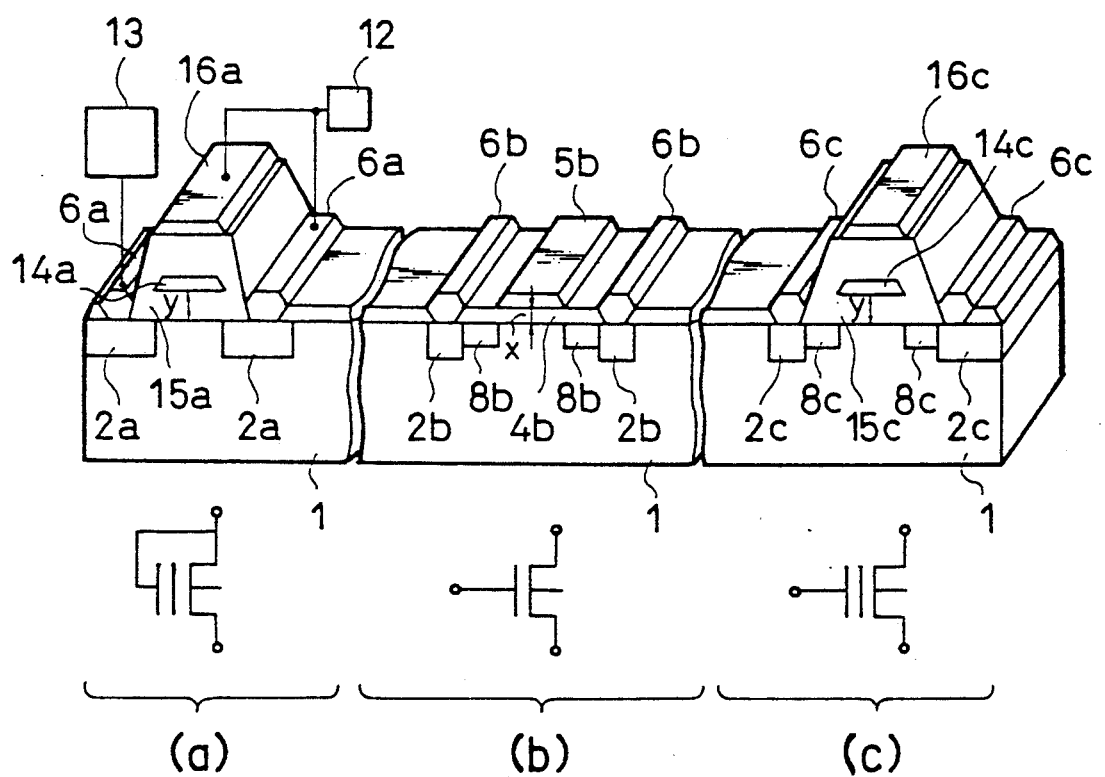
FIG. 2 is a perspective diagram showing a cross sectional configuration of a first embodiment of a semiconductor device with an input protection circuit according to the present invention.

Referring now to FIG. 2, a first embodiment of a semiconductor device with an input protection circuit according to the present invention will be described in detail.

In this first embodiment, an input protection circuit has a configuration shown in a section (a) of FIG. 2 which comprises: a semiconductor substrate 1: a source region 2a and a drain region 2a formed in the semiconductor substrate 1; a thick gate insulation film 15a formed on the semiconductor substrate 1 at a portion sandwiched between the source region 2a and the drain region 2a; a first semiconductor poly-crystalline layer 14a as a first gate electrode formed inside the thick gate insulation film 15a; a second semiconductor poly-crystalline layer 16a as a second gate electrode provided on the thick gate insulation film 15a; and a source electrode 6a and a drain electrode 6a which are formed on the source region 2a and the drain region 2a, where the second semiconductor poly-crystalline layer 14a and one of the source electrode 6a and the drain electrode 6a are connected with a power source 12 while the other one of the source electrode 6a and the drain electrode 6a is connected with the input terminal 13.

In this input protection circuit, the film thickness y for a portion of the thick gate insulation film 15a located between the first semiconductor poly-crystalline layer 14a and the semiconductor substrate 1 is made to be about 450 Å which is thicker than the thickness of the gate insulation film in a conventional input protection circuit. As a result, within the range of the voltages used for the usual operations, it is possible in this input protection circuit to prevent the lowering of the reliability due to the decrease of the current caused by the increase of the threshold voltage, without employing the LDD structure.

In addition, the source region 2a and the drain region 2a are formed to have a high impurity concentration such as $1 \times 10^{20}$ cm$^{-3}$ such that the source region 2a and the drain region 2a have low resistivity. As a result even when the excessive voltage is applied to the input terminal 13, the damaging of the junction between the semiconductor substrate 1 and each one of the source region 2a and the drain region 2a due to the generation of heat at the source region 2a and the drain region 2a can be prevented.

Moreover, the excessive voltage applied to the input terminal 13 can be absorbed by the operation of a bipolar transistor formed by the drain region 2a as a collector region, the semiconductor substrate 1 as a base region, and the source region 2a as an emitter region.

Figure 1:
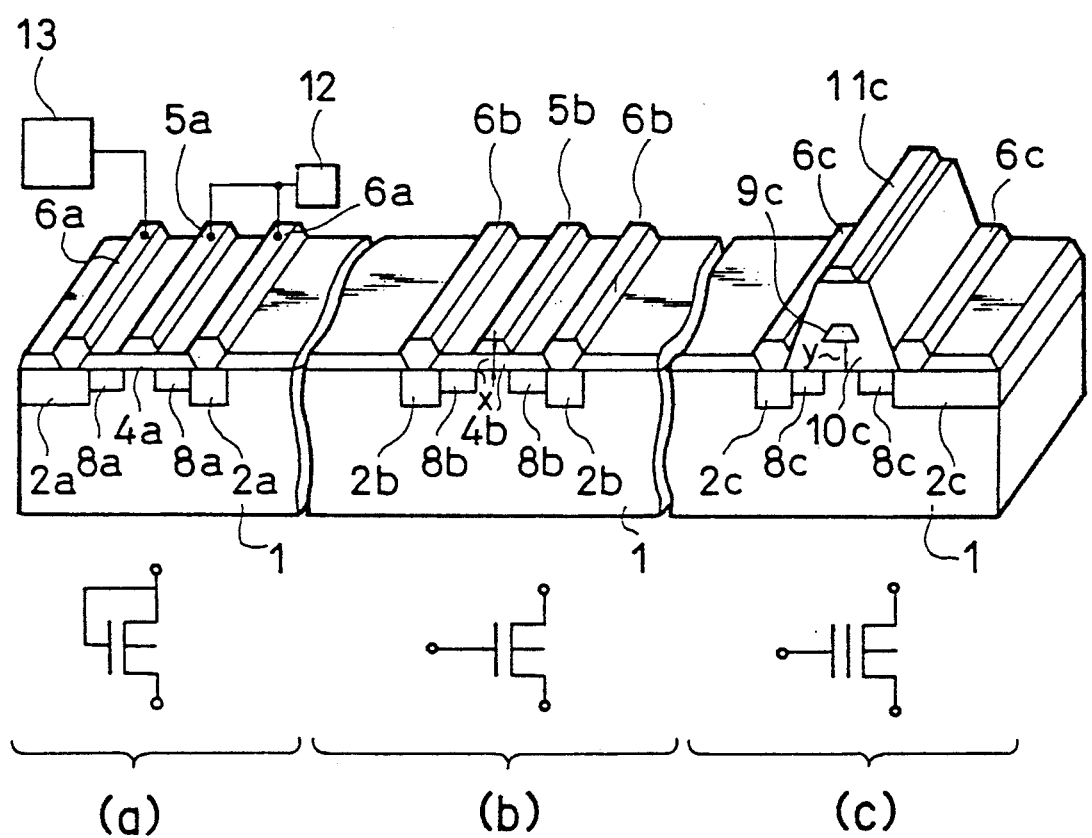
FIG. 1 is a perspective diagram showing a cross sectional configuration of a conventional semiconductor device with an input protection circuit.

The ordinary voltage FET to be operated by the ordinary power source has a configuration shown in a section (b) of FIG. 2 while the high withstand voltage FET has a configuration shown in a section (c) of FIG. 2 which are identical to those of a conventional semiconductor device shown in the sections (b) and (c) of FIG. 1, so that their description will be omitted.

It is to be noted that in this first embodiment, the input protection circuit has the gate structure similar to that of the high withstand voltage FET, so that this semiconductor device can be manufactured without changing types of manufacturing process from those used for manufacturing a conventional semiconductor device and therefore it can be manufactured at the same production rate as the conventional semiconductor device even though the structure of the input protection circuit is different from that of the conventional semiconductor device.

Figure 3:
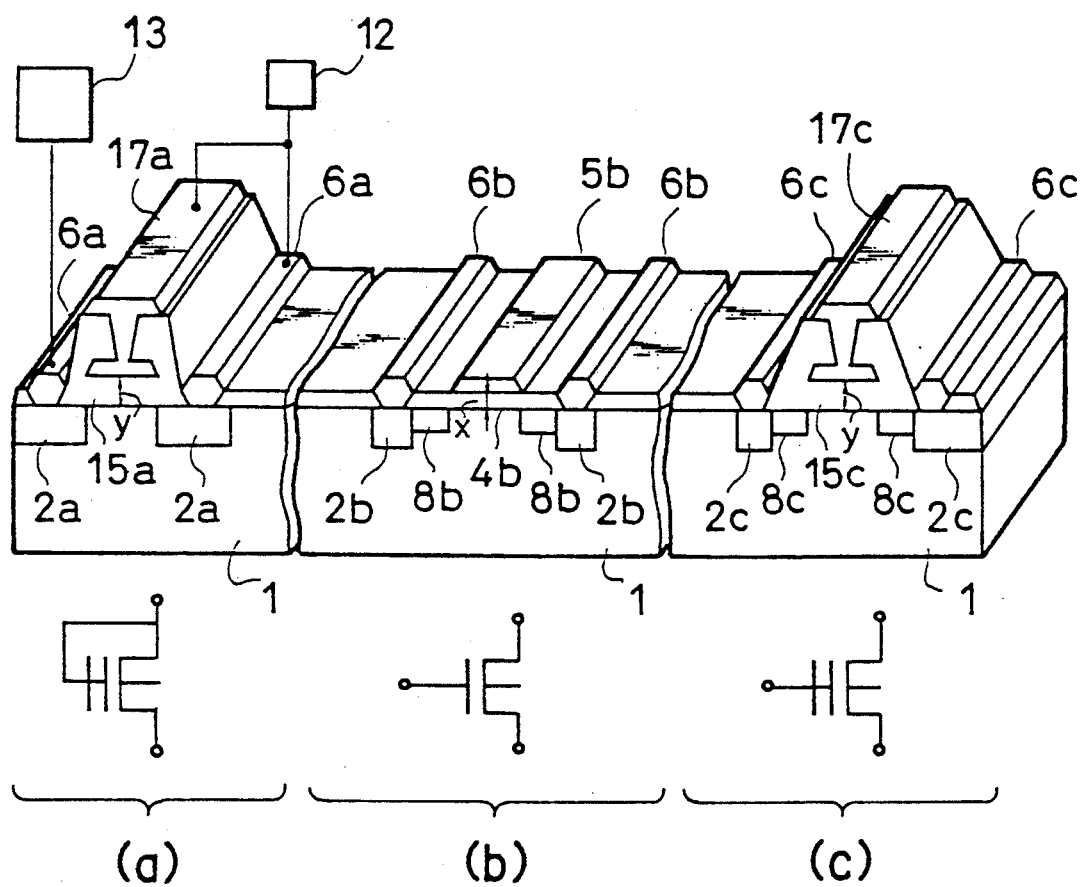
FIG. 3 is a perspective diagram showing a cross sectional configuration of a second embodiment of a semiconductor device with an input protection circuit according to the present invention.

Referring now to FIG. 3, a second embodiment of a semiconductor device with an input protection circuit according to the present invention will be described in detail.

This second embodiment differs from the first embodiment described above in that the first semiconductor poly crystalline layer 14a and the second semiconductor poly-crystalline layer 10a of the input protection circuit shown in a section (a) of FIG. 2 are connected together inside the thick gate insulation film 15a to form a semiconductor poly-crystalline layer 17a shown in a section (a) of FIG. 3, while the other configurations remain identical. Similarly in this second embodiment the first semiconductor poly-crystalline layer 14c and the second semiconductor poly-crystalline layer 16c of the high withstand voltage FET shown in a section (c) of FIG. 2 are connected together inside the thick gate insulation film 15c to form a semiconductor poly-crystalline layer 17c shown in a section (c) of FIG. 3, while the other configurations remain identical.

The same advantages described above for the first embodiment of FIG. 2 are also obtainable by this second embodiment of FIG. 3.

Figure 4:
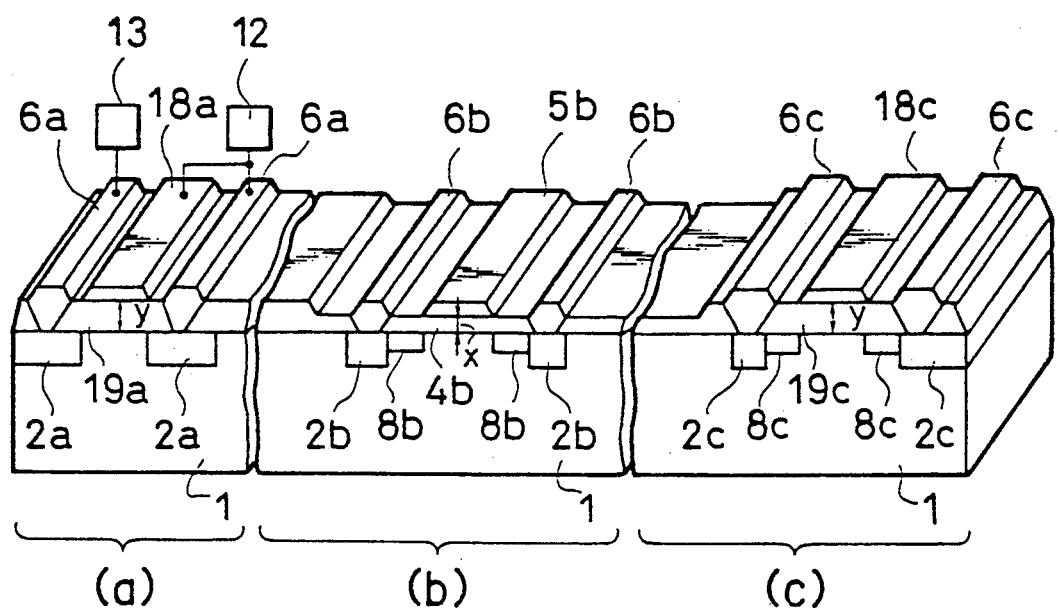
FIG. 4 is a perspective diagram showing a cross sectional configuration of a third embodiment of a semiconductor device with an input protection circuit according to the present invention.

Referring now to FIG. 4, a third embodiment of a semiconductor device with an input protection circuit according to the present invention will be described in detail.

This third embodiment differs from the first embodiment described above in that the thick gate insulation film 15a shown in a section (a) of FIG. 2 is replaced by a gate insulation film 19a shown in a section (a) of FIG. 4 which has a film thickness y of about 450 Å which is equal to that of a portion of the thick gate insulation film 15a located between the first semiconductor poly-crystalline layer 14a and the semiconductor substrate 1 in the first embodiment, and the first and second semiconductor poly-crystalline layers 14a and 16a are replaced by a single semiconductor poly-crystalline layer 18a provided on this gate insulation film 19a, while the other configurations remain identical. Similarly in this third embodiment, the thick gate insulation film 15c of the high withstand voltage FET shown in a section (c) of FIG. 2 is replaced by a gate insulation film 19c shown in a section (c) of FIG. 4 which has a film thickness y of about 450 Å which is equal to that of a portion of the thick gate insulation film 15c located between the first semiconductor poly-crystalline layer 14c and the semiconductor substrate 1 in the first embodiment, and the first and second semiconductor poly-crystalline layers 14c and 16c are replaced by a single semiconductor poly-crystalline layer 18c provided on this gate insulation film 19c, while the other configurations remain identical.

The same advantages described above for the first embodiment of FIG. 2 are also obtainable by this third embodiment of FIG. 4.

Figure 5:
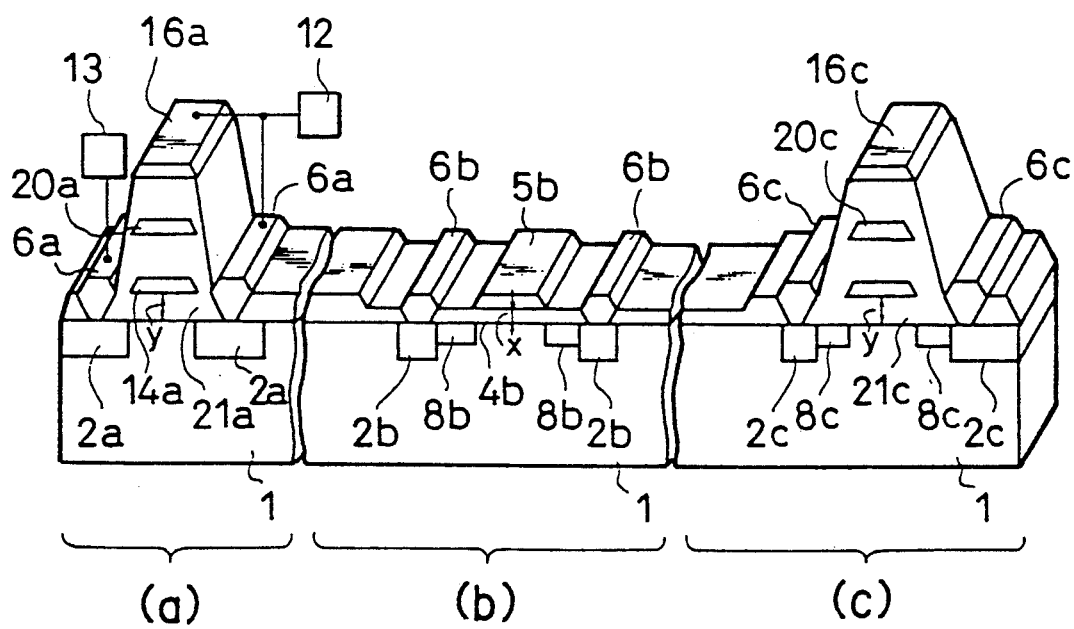
FIG. 5 is a perspective diagram showing a cross sectional configuration of a fourth embodiment of a semiconductor device with an input protection circuit according to the present invention.

Referring now to FIG. 5 a fourth embodiment of a semiconductor device with an input protection circuit according to the present invention will be described in detail.

This fourth embodiment differs from the first embodiment described above in that the thick gate insulation film 15a shown in a section (a) of FIG. 2 is replaced by a still thicker gate insulation film 21a shown in a section (a) of FIG. 4 which has an extra thickness on above the first semiconductor poly-crystalline layer 14a, and there is provided a third semiconductor polycrystalline layer 20a formed above the first semiconductor poly-crystalline layer 14a inside this extra thickness portion of the still thicker gate insulation film 21a, while the other configurations remain identical. Similarly, in this fourth embodiment, the thick gate insulation film 15c of the high withstand voltage FET shown in a section (c) of FIG. 2 is replaced by a still thicker gate insulation film 21c shown in a section (c) of FIG. 4 which has an extra thickness on above the first semiconductor poly-crystalline layer 14c, and there is provided a third semiconductor poly-crystalline layer 20c formed above the first semiconductor poly-crystalline layer 14c inside this extra thickness portion of the still thicker gate insulation film 21c, while the other configurations remain identical.

The same advantages described above for the first embodiment of FIG. 2 are also obtainable by this fourth embodiment of FIG. 5.

Figure 6:
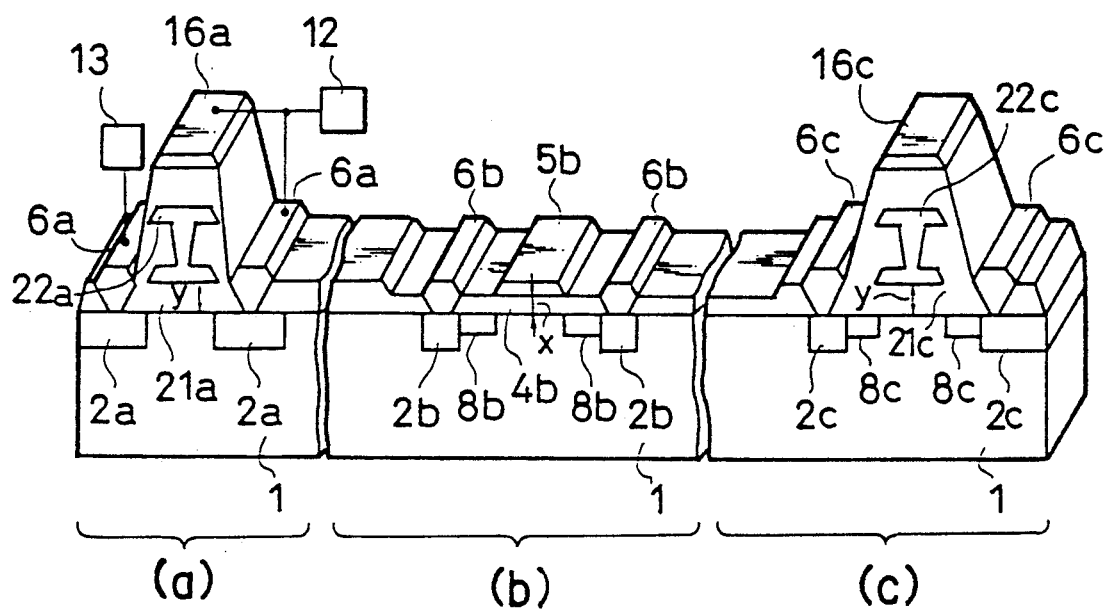
FIG. 6 is a perspective diagram showing a cross sectional configuration of a fifth embodiment of a semiconductor device with an input protection circuit according to the present invention.

Referring now to FIG. 6, a fifth embodiment of a semiconductor device with an input protection circuit according to the present invention will be described in detail.

This fifth embodiment differs from the fourth embodiment described above in that the first semiconductor poly-crystalline layer 14a and the third semiconductor poly-crystalline layer 20a of the input protection circuit shown in a section (a) of FIG. 5 are connected together inside the still thicker gate insulation film 21a to form a semiconductor poly-crystalline layer 22a shown in a section (a) of FIG. 6, while the other configurations remain identical. Similarly in this fifth embodiment, the first semiconductor poly-crystalline layer 14c and the third semiconductor poly-crystalline layer 20c of the high withstand voltage FET shown in a section (c) of FIG. 5 are connected together inside the still thicker gate insulation film 21c to form a semiconductor poly-crystalline layer 22c shown in a section (c) of FIG. 6, while the other configurations remain identical.

The same advantages described above for the first embodiment of FIG. 2 are also obtainable by this fifth embodiment of FIG. 6.

Figure 7:
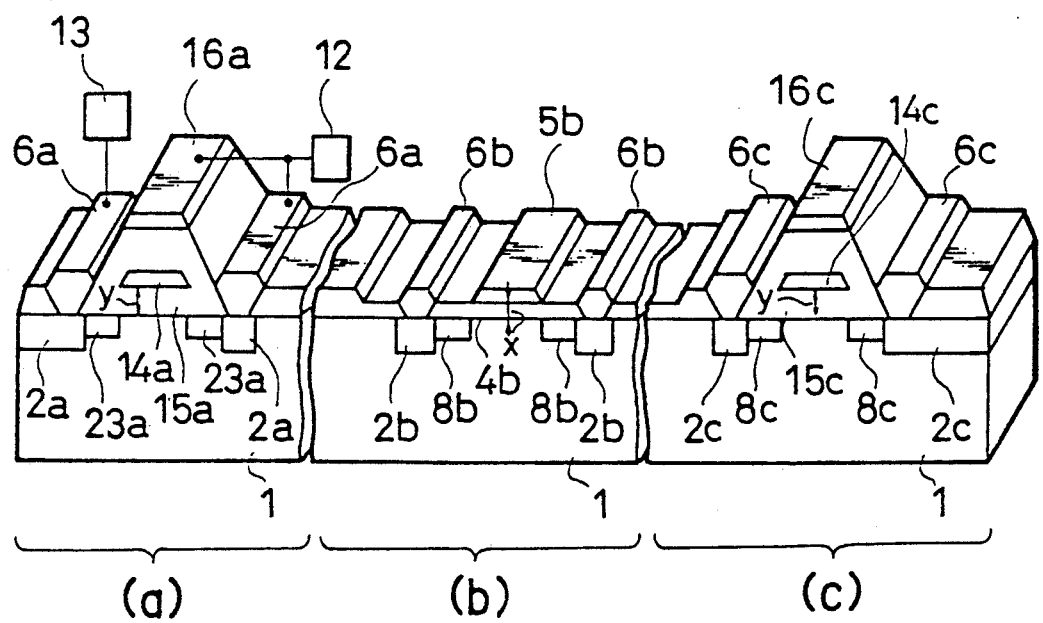
FIG. 7 is a perspective diagram showing a cross sectional configuration of a sixth embodiment of a semiconductor device with an input protection circuit according to the present invention.

Referring now to FIG. 7, a sixth embodiment of a semiconductor device with an input protection circuit according to the present invention will be described in detail.

This sixth embodiment differs from the first embodiment described above in that the input protection circuit shown in a section (a) of FIG. 7 additionally incorporates an LDD structure formed by low concentration diffusion layer regions 23a provided adjacent to the source region 2a and the drain region 2a at portions underneath the thick gate insulation film 14a corresponding to the intervals between the first semiconductor poly-crystalline layer 14a and each one of the source electrode 6a and the drain electrode 6a, while the other configurations remain identical.

The same advantages described above for the first embodiment of FIG. 2 are also obtainable by this sixth embodiment of FIG. 7.

As described, according to the present invention, it becomes possible to provide a semiconductor device of a high withstand voltage and an improved reliability by employing the FET having a gate insulation film thicker than that in an ordinary voltage FET to be operated by the ordinary power source for the input protection circuit.

It is to be noted that many modifications and variations of the above embodiments may be made without departing from the novel and advantageous features of the present invention. Accordingly, all such modifications and variations are intended to be included within the scope of the appended claims.

What is claimed is:

1. An input protection circuit for a semiconductor device using a FET, comprising:
    a semiconductor substrate;
    a source region formed in the semiconductor substrate;
    a drain region formed in the semiconductor substrate;
    a gate insulation film provided on the semiconductor substrate corresponding to a region between the source region and the drain region, having a thickness greater than that of a gate insulation film in the FET of the semiconductor device;
    wherein one of the source region and the drain region is connected with an external input terminal for the semiconductor device, while the gate electrode and the other one of the source region and the drain region are connected with a power source for the semiconductor device.

2. The input protection circuit of claim 1, wherein the thickness of the gate insulation film is greater than 450 Å.

3. The input protection circuit of claim 1, wherein the gate electrode and the additional gate electrode is connected together inside the gate insulation film.

4. The input protection circuit of claim 1, further comprising an extra gate electrode provided inside the gate insulation film at such a position that the thickness of the gate insulation film between the extra gate electrode and the semiconductor substrate is greater than the thickness of the gate insulation film in the FET of the semiconductor device.

5. The input protection circuit of claim 4, wherein the extra gate electrode and the additional gate electrode is connected together inside the gate insulation film.

6. The input protection circuit of claim 1, further comprising low impurity concentration diffusion layer regions provided adjacent to the source region and the drain region at portions underneath the gate insulation film corresponding to intervals between the gate electrode and each one of the source region and the drain region.

7. The input protection circuit of claim 1, wherein the source region and the drain region are formed to have a high impurity concentration.

8. The input protection circuit of claim 7, wherein the impurity concentration of the source region and the drain region is greater than $1 \times 10^{20}$ cm$^{-3}$.

9. The input protection circuit of claim 1, wherein the semiconductor substrate, source region, and drain region form a bipolar transistor configuration with the semiconductor substrate as a base region, the source region as an emitter region, and the drain region as a collector region.

10. The input protection circuit of claim 1, wherein the semiconductor device also includes a high withstand voltage FET, and the thickness of the gate insulation film is equal to that of a gate insulation film of the high withstand voltage FET of the semiconductor device.

11. The input protection circuit of claim 10, wherein the input protection circuit has a gate structure identical to that of the high withstand voltage FET.

12. A semiconductor device, comprising: a FET; and an input protection device, including:
    a semiconductor substrate;
    a source region formed in the semiconductor substrate;
    a drain region formed in the semiconductor substrate;
    a gate insulation film provided on the semiconductor substrate corresponding to a region between the source region and the drain region, having a thickness greater than that of a gate insulation film in the FET of the semiconductor device;
    a gate electrode provided on the gate insulation film; and
    an additional gate electrode provided inside the gate insulation film at such a position that the thickness of the gate insulation film between the additional gate electrode and the semiconductor substrate is greater than the thickness of the gate insulation film in the FET of the semiconductor device;
    wherein one of the source region and the drain region is connected with an external input terminal for the semiconductor device, while the gate electrode and the other one of the source region and the drain region are connected with a power source for the semiconductor device.

13. The semiconductor device of claim 12, wherein the thickness of the gate insulation film is greater than 450 Å.

14. The semiconductor device of claim 12, wherein the gate electrode and the additional gate electrode is connected together inside the gate insulation film.

15. The semiconductor device of claim 12, further comprising an extra gate electrode provided inside the gate insulation film at such a position that the thickness of the gate insulation film between the extra gate electrode and the semiconductor substrate is greater than the thickness of the gate insulation film i the FET of the semiconductor device.

16. The semiconductor device of claim 15, wherein the extra gate electrode and the additional gate electrode is connected together inside the gate insulation film.

17. The semiconductor device of claim 12, further comprising low impurity concentration diffusion layer regions provided adjacent to the source region and the drain region at portions underneath the gate insulation film corresponding to the intervals between the gate electrode and each one of the source region and the drain region.

18. The semiconductor device of claim 12, wherein the source region and the drain region are formed to have a high impurity concentration.

19. The semiconductor device of claim 18, wherein the impurity concentration of the source region and the drain region is greater than $1 \times 10^{20}$ cm$^{-3}$.

20. The semiconductor device of claim 12, wherein the semiconductor substrate, source region, and drain region form a bipolar transistor configuration with the semiconductor substrate as a base region, the source region as an emitter region, and the drain region as a collector region.

21. The semiconductor device of claim 12, further including a high withstand voltage FET, where the thickness of the gate insulation film of the input protection circuit is equal to that of a gate insulation film of the high withstand voltage FET.

22. The semiconductor device of claim 21, wherein the input protection circuit has a gate structure identical to that of the high withstand voltage FET.

* * * * *